(12) United States Patent
Shiraishi

(10) Patent No.: US 12,538,502 B2
(45) Date of Patent: Jan. 27, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventor: Nobuhito Shiraishi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 429 days.

(21) Appl. No.: 18/194,802

(22) Filed: Apr. 3, 2023

(65) Prior Publication Data
US 2023/0402494 A1    Dec. 14, 2023

(30) Foreign Application Priority Data

Jun. 13, 2022  (JP) ................................. 2022-094985

(51) Int. Cl.
| | | |
|---|---|---|
| *H10D 1/47* | (2025.01) | |
| *H01C 7/00* | (2006.01) | |
| *H01C 17/12* | (2006.01) | |
| *H01L 21/768* | (2006.01) | |
| *H01L 23/522* | (2006.01) | |

(52) U.S. Cl.
CPC ............ *H10D 1/474* (2025.01); *H01C 7/006* (2013.01); *H01C 17/12* (2013.01); *H01L 21/76843* (2013.01); *H01L 21/76877* (2013.01); *H01L 23/5228* (2013.01)

(58) Field of Classification Search
CPC .............. H10D 1/474; H01L 21/76843; H01L 21/76877; H01L 23/5228; H01C 7/006
See application file for complete search history.

(56) References Cited

U.S. PATENT DOCUMENTS

| | | | | |
|---|---|---|---|---|
| 6,034,411 | A * | 3/2000 | Wade ....................... | H10D 1/47 338/307 |
| 6,207,560 | B1 * | 3/2001 | Lee ................... | H01L 21/76843 438/618 |
| 6,703,666 | B1 * | 3/2004 | Huttemann ......... | H01L 23/5228 257/E27.047 |
| 7,208,388 | B2 * | 4/2007 | Beach ................. | H01L 23/5228 438/692 |

(Continued)

FOREIGN PATENT DOCUMENTS

JP        2020-065075 A        4/2020

OTHER PUBLICATIONS

US 9,786,594 B2, 10/2017, Tokumitsu et al. (withdrawn)

*Primary Examiner* — Bac H Au
(74) *Attorney, Agent, or Firm* — Rimon P.C.

(57) ABSTRACT

A semiconductor device includes a wiring layer, a dielectric layer covering the wiring layer, a thin film resistor provided on the dielectric layer, and a plug electrode connecting the thin film resistor to the wiring layer. The plug electrode includes a barrier layer and a buried layer. The buried layer is configured by the filling portion filling a region surrounded by a first incline surface, and an extension portion extending from the filling portion along a second incline surface. The thin film resistor is in contact with the filling portion and the extension portion of the plug electrode. A second incline angle between the second incline surface and a main surface of a semiconductor substrate is smaller than a first incline angle between the first incline surface and the main surface of the semiconductor substrate.

7 Claims, 17 Drawing Sheets

(56) References Cited

U.S. PATENT DOCUMENTS

| | | | | |
|---|---|---|---|---|
| 7,403,094 B2* | 7/2008 | Beach | H10D 86/85 | |
| | | | 257/536 | |
| 7,468,533 B2* | 12/2008 | Hanson | H01L 21/76843 | |
| | | | 257/605 | |
| 9,240,439 B2* | 1/2016 | Yagi | H01L 21/3081 | |
| 2003/0052386 A1* | 3/2003 | Yamaguchi | H10D 1/47 | |
| | | | 257/E27.047 | |
| 2014/0239445 A1* | 8/2014 | Nishimura | H10D 1/692 | |
| | | | 257/532 | |
| 2015/0069574 A1* | 3/2015 | Tseng | H01L 21/707 | |
| | | | 438/384 | |
| 2016/0020148 A1* | 1/2016 | Song | H10D 84/0149 | |
| | | | 438/238 | |
| 2018/0166402 A1* | 6/2018 | Sardesai | H01L 23/53252 | |
| 2023/0097408 A1* | 3/2023 | Ito | H01C 17/12 | |
| | | | 438/384 | |
| 2023/0343701 A1* | 10/2023 | Shiraishi | H01L 21/76832 | |

\* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2022-094985 filed on Jun. 13, 2022, including the specification, drawings and abstract is incorporated herein by reference in its entirety.

BACKGROUND

The present disclosure relates to a semiconductor device and method of manufacturing the same and, for example, to a semiconductor device incorporating a thin film resistor and method of manufacturing the same.

For example, in a microcontroller chip having a OCO (On Chip Oscillator) circuit or in an analog semiconductor device having an AD/DA converter circuit, it is common to incorporate a resistor element in a semiconductor chip. Since a high sheet-resistance and a low TCR (Temperature Coefficient of Resistance) are required for such a resistor element, a metal thin film resistor is used.

There are disclosed techniques listed below.
 [Patent Document 1] Japanese Unexamined Patent Application Publication No. 2020-65075

Patent Document 1 discloses a thin film resistor connected to a lower wiring via a tungsten (W) plug electrode.

SUMMARY

According to studies by the inventors of the present application, the following problems have been confirmed. The plug electrode is formed by filling an opening formed in a dielectric layer with a tungsten film and then selectively leaving the tungsten film only in the opening by a CMP (Chemical Mechanical Polishing) method. However, an opening diameter of the opening decreases from an upper surface of the dielectric layer toward a bottom of the opening. That is, a sidewall of the opening is an incline surface. Further, when the tungsten film is polished by CMP method, a height of polished surface of the tungsten film becomes lower than the upper surface of the dielectric layer. That is, a "step" is generated between the upper surface of the dielectric layer and the polished surface. This is because a slurry having a high polishing rate of the tungsten film to the dielectric layer is used, and overpolishing is required to completely polish and remove the tungsten film on the upper surface of the dielectric layer. Then, when the "step" is generated by overpolishing, the diameter of the plug electrode in plan view is reduced, and thus the problem that the contact resistance with the thin film resistor formed on the plug electrode is increased was confirmed.

In order to eliminate the "step", following the above-described polishing, a buff polishing is performed using a slurry having a high polishing rate of the dielectric layer to the tungsten film, whereby the polished surfaces of the dielectric layer and the tungsten film can be made substantially uniform. However, the above-described problem of reducing the diameter of the plug electrode in plan view is not solved. Furthermore, there is also a problem that the manufacturing cost increases when the buff polishing is used.

There is a need for a technique for reducing the contact resistance between the thin film resistor and the plug electrode without increasing the manufacturing cost.

Other objects and novel features will become apparent from the description of this specification and the accompanying drawings.

The typical ones of the embodiments disclosed in the present application will be briefly described as follows.

A semiconductor device according to one embodiment includes a wiring layer, a dielectric layer covering the wiring layer, a thin film resistor provided on the dielectric layer, and a plug electrode connecting the thin film resistor to the wiring layer. The plug electrode includes a barrier layer and a buried layer, and the buried layer includes a filling portion filling a region surrounded by a first incline surface, and an extension portion extending from the filling portion along a second incline surface. The thin film resistor is in contact with the filling portion and the extension portion of the plug electrode, a second incline angle between the second incline surface and a main surface of a semiconductor substrate is smaller than a first incline angle between the first incline surface and the main surface of the semiconductor substrate.

A method of manufacturing a semiconductor device according to one embodiment is a method of manufacturing the semiconductor device including a wiring layer, a dielectric layer covering the wiring layer, a thin film resistor provided on the dielectric layer, and a plug electrode provided in the dielectric layer, connecting the thin film resistor to the wiring layer and including a barrier layer and a buried layer. The method includes: preparing a semiconductor substrate having a main surface, the wiring layer provided on the main surface of the semiconductor substrate, and the dielectric layer covering the wiring layer and having an upper surface; and forming a first opening in the dielectric layer, the first opening exposing a part of the wiring layer and being surrounded by a first incline surface. Further, the method includes: forming a second opening surrounded by a second incline surface in an upper portion of the first opening; forming a barrier layer on the wiring layer exposed from the first opening, on the first incline surface, on the second incline surface, and on the upper surface; and forming a buried metal layer on the barrier layer to fill the first opening and the second opening. Further, the method includes: performing a CMP treatment to the buried metal layer and removing the barrier layer and the buried metal layer on the upper surface and in the second opening, thereby forming a filling portion configuring a part of the buried layer so as to fill the first opening and a part of the second opening. Further, the method includes: performing a sputter etching treatment to the filling portion, thereby forming an extension portion extending from the filling portion on the barrier layer along the second incline surface and configuring a part of the buried layer; and forming the thin film resistor on the plug electrode so as to be in contact with the filling portion and the extension portion. The first incline surface has a first incline angle to the main surface, the second incline surface has a second incline angle to the main surface, and the second incline angle is smaller than the first incline angle.

According to one embodiment, the contact resistance between the thin film resistor and the plug electrode can be reduced.

DETAILED DESCRIPTION

Figure 1:
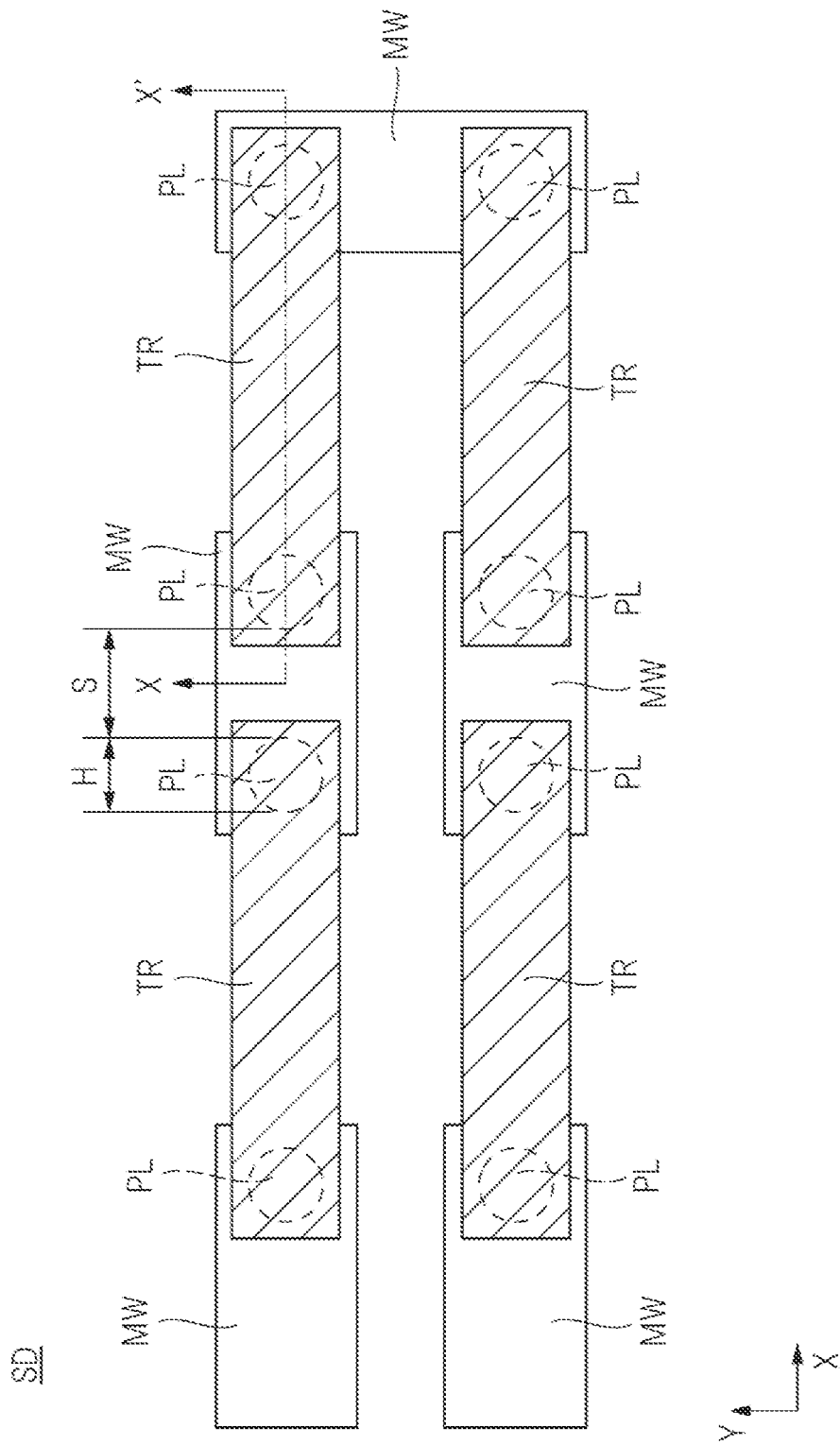
FIG. 1 is a plan view of a semiconductor device of a present embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other.

In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiments, it is needless to say that the constituent elements (including element steps and the like) are not necessarily essential except in the case where they are specifically specified and the case where they are considered to be obviously essential in principle.

Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, the same members are denoted by the same reference numerals in principle, and repetitive descriptions thereof are omitted. Note that even plan view may be hatched for the sake of clarity.

Figure 2:
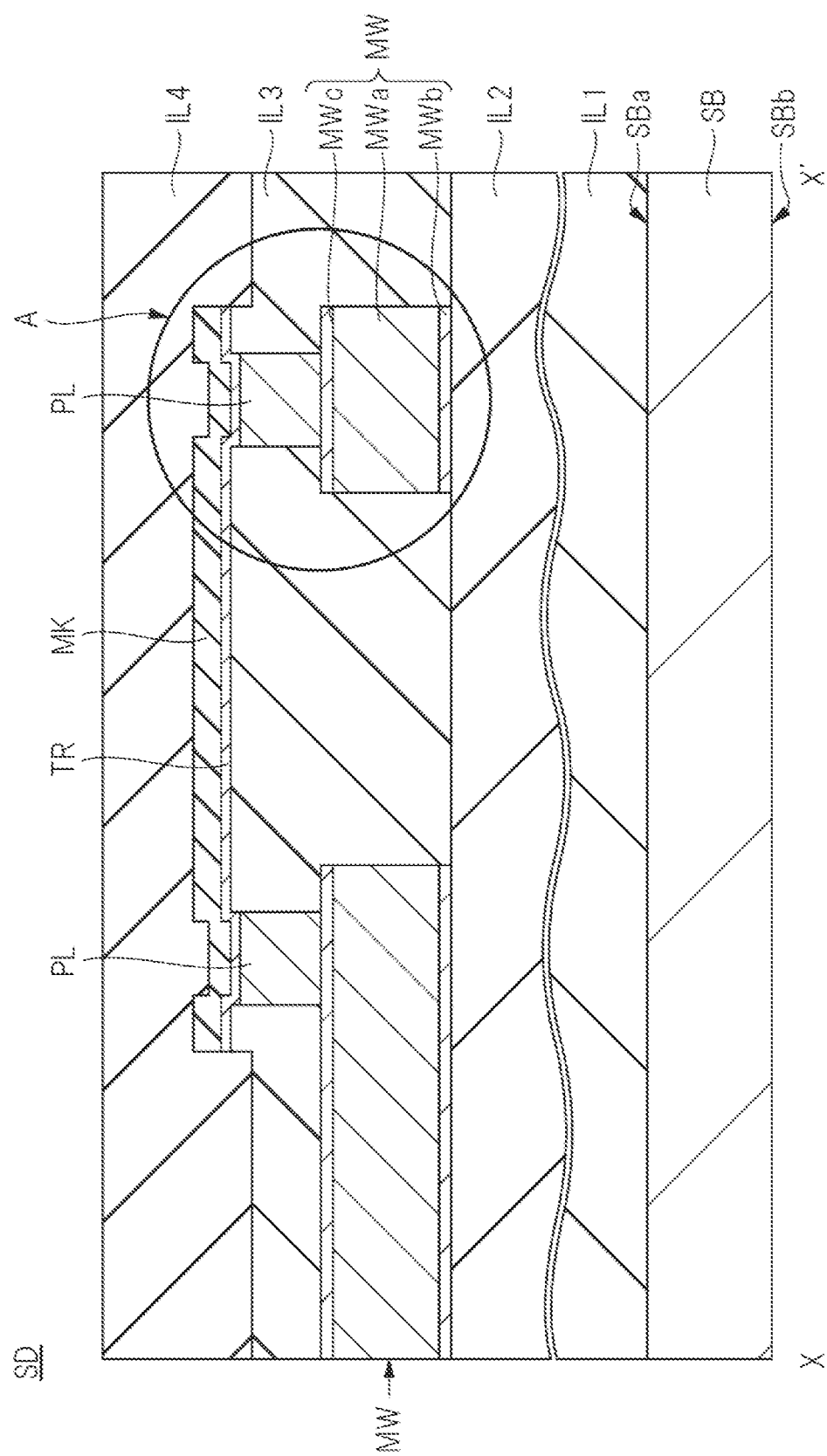
FIG. 2 is a cross-sectional view along X-X' line of FIG. 1.
Figure 3:
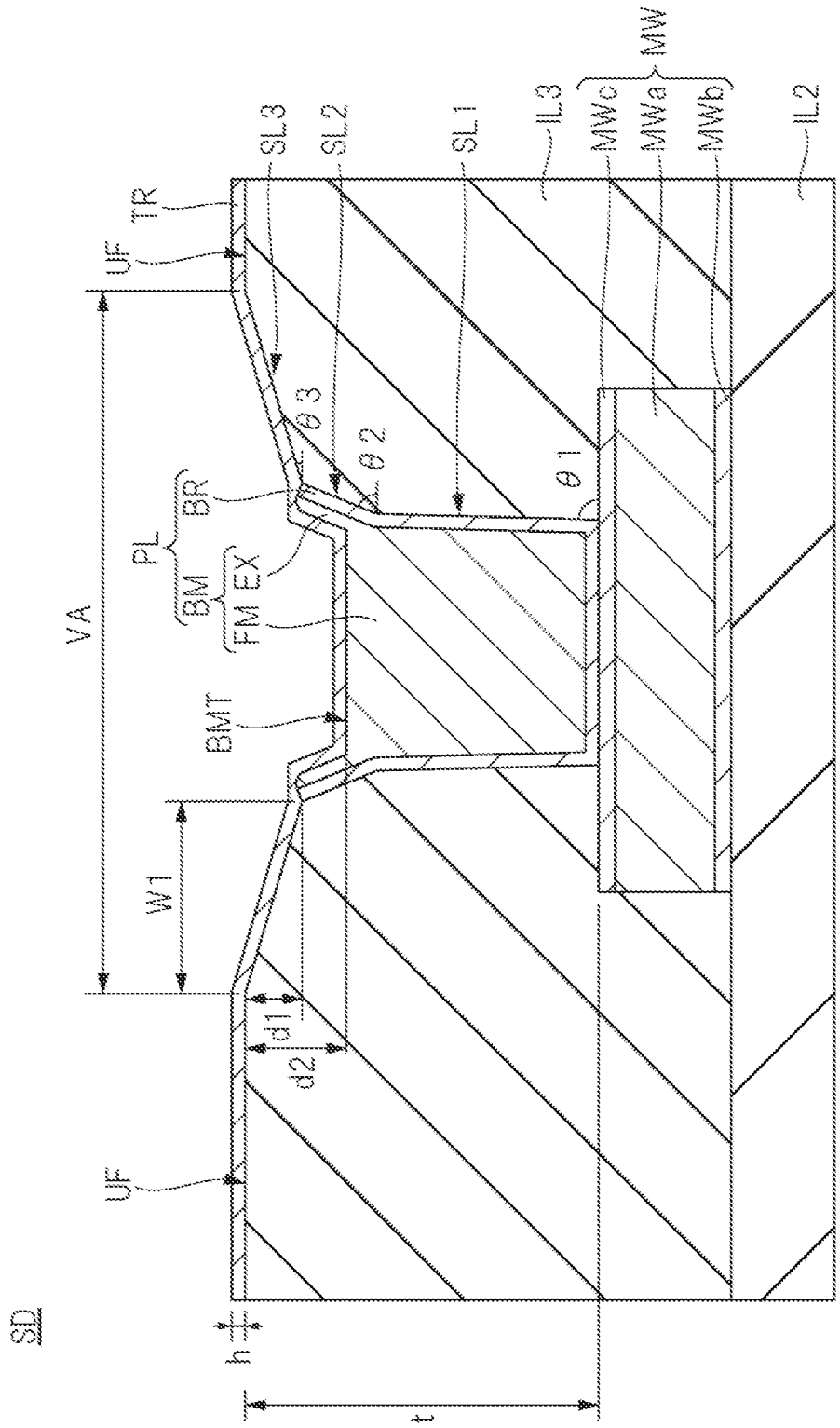
FIG. 3 is an enlarged cross-sectional view of part A of FIG. 2.

Although a semiconductor substrate SB is omitted from FIG. 3 and thereafter, as shown in FIG. 2, a wiring layer MW, a plug electrode PL, and a thin film resistor TR are formed on the semiconductor substrate SB, and therefore, the terms such as the semiconductor substrate SB and a main surface SBa may be used in the explanation of FIG. 3 and thereafter.

Also, the term "depth" or "height" means a distance between an A-plane (or A-point) and a B-plane (or B-point) in a direction orthogonal to the main surface SBa of the semiconductor substrate SB.

Embodiment

Structure of Semiconductor Device

FIG. 1 is a plan view of the semiconductor device of the present embodiment. FIG. 2 is a cross-sectional view along X-X' line of FIG. 1. FIG. 3 is an enlarged cross-sectional view of part A of FIG. 2. However, a mask layer MK and a dielectric layer IL4 described later are omitted from FIG. 3 and thereafter.

As shown in FIG. 1, the semiconductor device SD includes a plurality of thin film resistors (thin film resistor elements) TR. In plan view, each of the plurality of thin film resistors TR has a substantially rectangular shape extending in a X direction and having a desired width in a Y direction. The substantially rectangular shape includes a shape in which four corners are chamfered or rounded. The X direction and the Y direction are along the main surface SBa of the semiconductor substrate SB (see FIG. 2) and orthogonal to each other. The plurality of thin film resistors TR are arranged in a matrix in the X direction and the Y direction. Each of the plurality of thin film resistors TR is connected to the lower wiring layer MW by the plug electrode PL arranged at both ends thereof. In FIG. 1, four thin film resistors TR are connected in series by wiring layers MW, but the plurality of thin film resistors TR can be connected in parallel. In addition, the plurality of the thin film resistor TR connected in series can be connected in parallel, and the plurality of the thin film resistor TR connected in parallel can be connected in series.

The relationship between the diameter H of the plug electrode PL and the distance S between the plug electrodes PL next to each other in the X direction and the Y direction is preferable H/S≤1. That is, the distance S between the plug electrodes PL next to each other is equal to or larger than the diameter H of the plug electrode PL. This is because when H/S>1, a polished surface BMT (refer to FIGS. 3 and 9) cannot be sufficiently lowered with respect to an upper surface UF of a dielectric layer IL3 surrounding the plug electrode PL in CMP step for forming the plug electrode PL, which will be described later. That is, by setting H/S≤1, in CMP step, the height of the plug electrode PL (in other words, the amount of descent of the polished surface BMT with respect to the upper surface UF of the dielectric layer IL3 or the depth of the polished surface BMT with respect to the upper surface UF) controllability is improved.

As shown in FIG. 2, the wiring layer MW, the plug electrode PL, and the thin film resistor TR are formed on the semiconductor substrate SB. The semiconductor substrate SB has a desired film thickness and has a flat main surface SBa and a flat back surface SBb. Although not shown, a plurality of MISFETs (Metal Insulator Semiconductor Field Effect Transistor) and an element isolation layer called an STI (Shallow Trench Isolation) surrounding MISFET are formed on the main surface SBa. The element isolation layer is provided to electrically isolate MISFETs next to each other. The element isolation layer is formed of a dielectric layer (for example, an oxide film) buried in the semiconductor substrate SB, and the element isolation layer (dielectric layer) has an upper surface that is parallel to the main surface SBa and the back surface SBb. When the reference plane of the incline angle described later is the main surface SBa, for example, the reference plane can be the upper surface of the element isolation layer. Further, the reference surface of the incline angle may be the back surface SBb. A plurality of dielectric layers IL1 and IL2 are formed on the main surface SBa, and for example, the wiring layer MW is formed on the dielectric layer IL2 which is planarized by a CMP method and has an upper surface substantially parallel to the main surface SBa. The wiring layer MW has a stacked structure of a main conductive layer MWa and barrier layers MWb and MWc. The main conductive layer MWa is, for example, a metal film formed of aluminum (Al) or copper (Cu) as the main component. The barrier layers MWb and MWc are formed of, for example, a stacked film of titanium (Ti) and titanium nitride (TiN) on titanium (Ti), a tantalum nitride (TaN) film, or a stacked film of tantalum (Ta) and tantalum nitride (TaN) on tantalum (Ta). The sidewall and the upper surface of the wiring layer MW is covered with the dielectric layer IL3. The dielectric layer IL3 may be formed of a stacked film, and for example, the dielectric layer covering the sidewall of the wiring layer MW and the dielectric layer covering the upper surface of the wiring layer MW may be formed as separate layers.

On the wiring layer MW, the plug electrode PL provided in the dielectric layer IL3 is arranged, and the thin film resistor TR is formed on the dielectric layer MW. The thin film resistor TR is electrically connected to the wiring layers MW by the plug electrodes PL located at both ends of the thin film resistor TR. The thin film resistor TR is covered with the mask layer MK and the dielectric layer IL4. The mask layer MK is a hard mask for processing the thin film resistor TR into a desired pattern, and is formed of, for example, an oxide film or a nitride film. The dielectric layers IL1 to IL4 are formed of, for example, an oxide film, a nitride film, or a stacked film of an oxide film and a nitride film.

As shown in FIG. 3, the thin film resistor TR is connected to the wiring layers MW via the plug electrodes PL. The wiring layers MW are covered with the dielectric layer IL3. The dielectric layer IL3 is planarized by CMP method and has the upper surface UF substantially parallel to the main surface SBa. A via hole (opening) VA exposing a part of the wiring layer MW is provided in the dielectric layer IL3, and the plug electrode PL is buried in the via hole VA, and the plug electrode PL is in contact with the wiring layer MW.

The via hole VA is an opening surrounded (defined) by a first incline surface SL1, a second incline surface SL2 and a third incline surface SL3 provided in the dielectric layer IL3. The first incline surface SL1, the second incline surface SL2, and the third incline surface SL3 are arranged in this order from the wiring layer MW toward the upper surface UF of the dielectric layer IL3. The first incline surface SL1, the second incline surface SL2, and the third incline surface SL3 have a first incline angle $\theta 1$, a second incline angle $\theta 2$, and a third incline angle $\theta 3$ to the main surface SBa of the semiconductor substrate SB. The second incline angle $\theta 2$ is smaller than the first incline angle $\theta 1$, and the third incline angle $\theta 3$ is smaller than the second incline angle $\theta 2$. For example, the first incline angle $\theta 1$ is, for example, 87° (84°≤$\theta 1$<90°). The second incline angle $\theta 2$ is, for example, 70° (65°≤$\theta 2$≤75°). The third incline angle $\theta 3$ is, for example, 20° (15°≤$\theta 3$≤25°). That is, the first incline surface SL1, the second incline surface SL2 and the third incline surface SL3 are inclined from a side of the wiring layer MW toward the upper surface UF of the dielectric layer IL3 such that the opening diameter of the via hole VA is widened.

The plug electrode PL is configured by a buried layer BM and a barrier layer BR. The barrier layer BR is formed continuously on the bottom surface of the via hole VA, the first incline surface SL1 and the second incline surface SL2, and the barrier layer BR provided on the bottom surface of the via hole VA is in contact with the wiring layer MW. The buried layer BM is formed on the barrier layer BR, and the buried layer BM includes a filling portion FM and an extension portion EX. The filling portion FM is formed so as to fill a part of a first opening OP1 surrounded by the first incline surface SL1 and a second opening OP2 surrounded by the second incline surface SL2 (refer to FIG. 9). The extension portion EX is formed on the barrier layer BR formed on the second incline surface SL2 so as to extend from the filling portion FM. The extension portion EX protrudes from the filling portion FM toward the upper surface UF of the dielectric layer IL3 along the second incline surface SL2. Therefore, the depth d2 from the upper surface UF of the dielectric layer IL3 to the polished surface BMT which is the upper surface of the dielectric layer IL3 is deeper (larger) than the depth d1 from the upper surface UF of the dielectric layer IL3 to the tip of the extension portion EX or the tip of the barrier layer FM (d2>d1). In other words, the tip of the extension portion EX or the tip of the barrier layer BR is farther from the main surface SBa of the semiconductor substrate SB than the polished surface BMT which is the upper surface of the filling portion FM.

The thin film resistor TR is provided on the upper surface UF of the dielectric layer IL3 and in the via hole VA, and is in contact with the plug electrode PL in the via hole VA. The thin film resistor TR is in contact with the filling portion FM and the extension portion EX of the plug electrode PL, and also in contact with the barrier layer BR on the second incline surface SL2. Since the thin film resistor TR is in contact with the filling portion FM and the extension portion EX of the plug electrode, as compared with the case where the plug electrode PL does not have the extension portion EX, the contact resistance between the thin film resistor TR and the plug electrode PL can be reduced. Further, since the thin film resistor TR is in contact with the filling portion FM, the extension portion EX of the plug electrode PL, and the barrier layer BR, as compared with the case where the extension portion EX and the barrier layer BR on the second incline surface SL2 are not present in the plug electrode PL, the contact resistance between the thin film resistor TR and the plug electrode PL can be reduced. When the plug electrode PL has the extension portion EX, the contact area between the thin film resistor TR and the plug electrode EX is increased in plan view and cross-sectional view, and consequently the contact resistance is reduced.

Further, the thin film resistor TR on the plug electrode PL extends on the upper surface UF of the dielectric layer IL3 via the third incline surface SL3. Since the third incline angle $\theta 3$ of the third incline surface SL3 is smaller than the first incline angle $\theta 1$ of the first incline surface SL1 and the second incline angle θ2 of the second incline surface SL2, disconnection of the thin film resistor TR can be prevented or suppressed. When the film thickness h of the thin film resistor TR is thinner than, for example, the step d1 due to the third incline surface SL3 (substantially equal to the depth d1 from the upper surface UF of the dielectric layer IL3 to the tip of the extension portion EX), it is effective to prevent disconnection of the thin film resistor TR by making (the length W1 of the third incline surface SL3 in the X-direction)>(the step h due to the third incline surface SL3).

The thin film resistor TR is formed of, for example, silicon-chromium (SiCr), silicon-chromium-carbon (SiCrC), nickel-chromium (NiCr), titanium nitride (TiN), tantalum nitride (TaN), or the like. The film thickness h of the thin film resistor TR is 5 nm to 10 nm. The depth d1 (step due to the third incline surface SL3) from the upper surface UF of the dielectric layer IL3 to the tip of the extension portion EX is 5 nm to 15 nm. The depth d2 from the upper surface UF of the dielectric layer IL3 to the polished surface BMT, which is the upper surface of the filling portion FM, is less than 50 nm.

Manufacturing Method of Semiconductor Device

Figure 4:
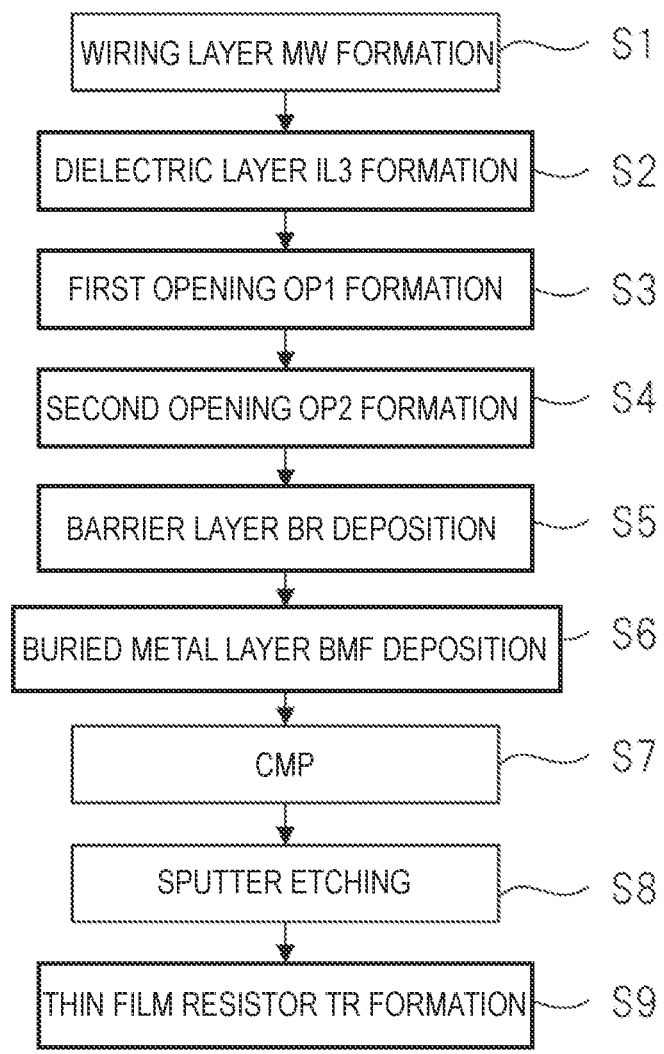
FIG. 4 is a process flow chart showing a manufacturing step of the semiconductor device of the present embodiment.
Figure 11:
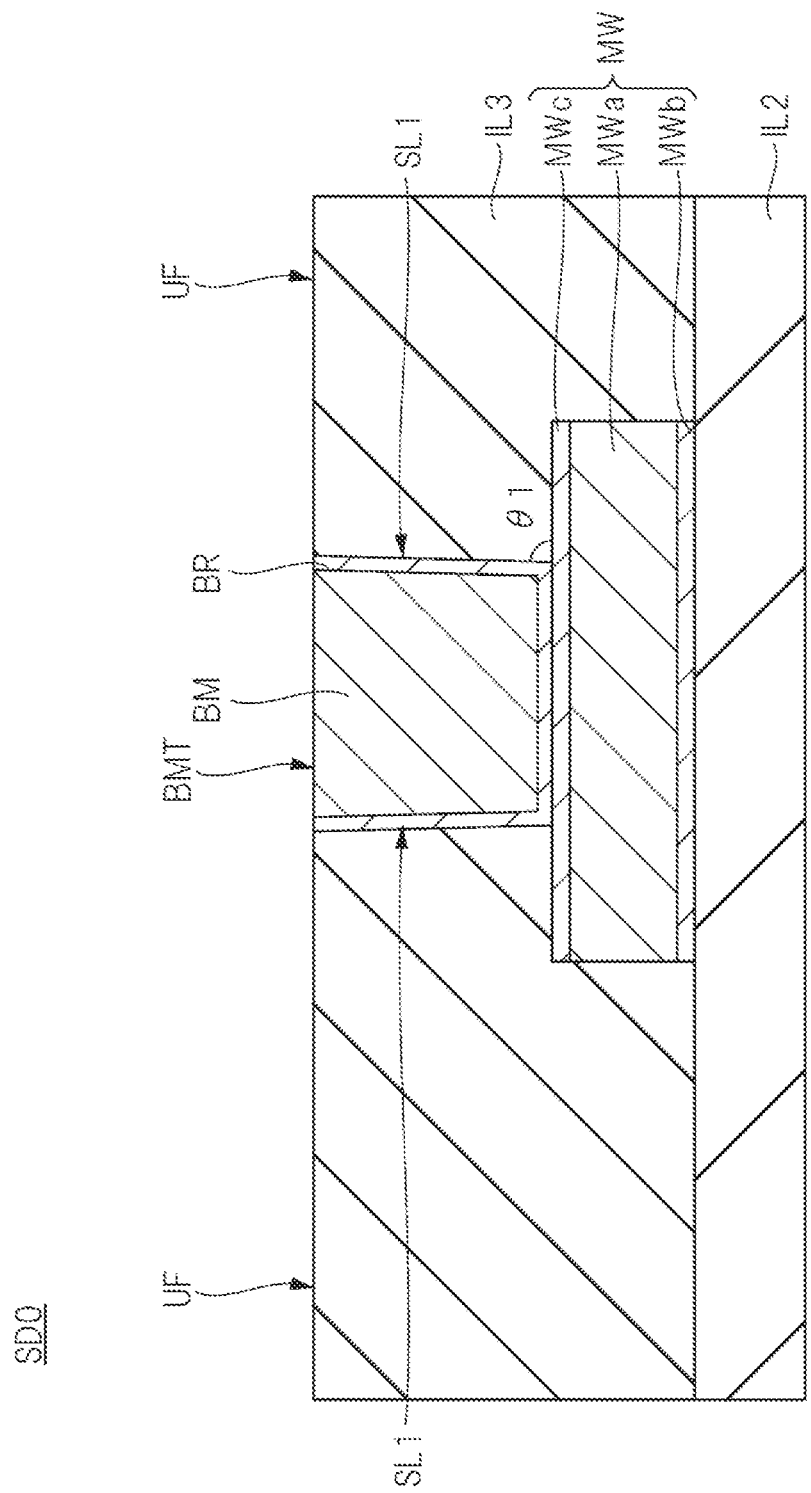
FIG. 11 is a cross-sectional view showing a manufacturing process of a semiconductor device of a comparative example.
Figure 12:
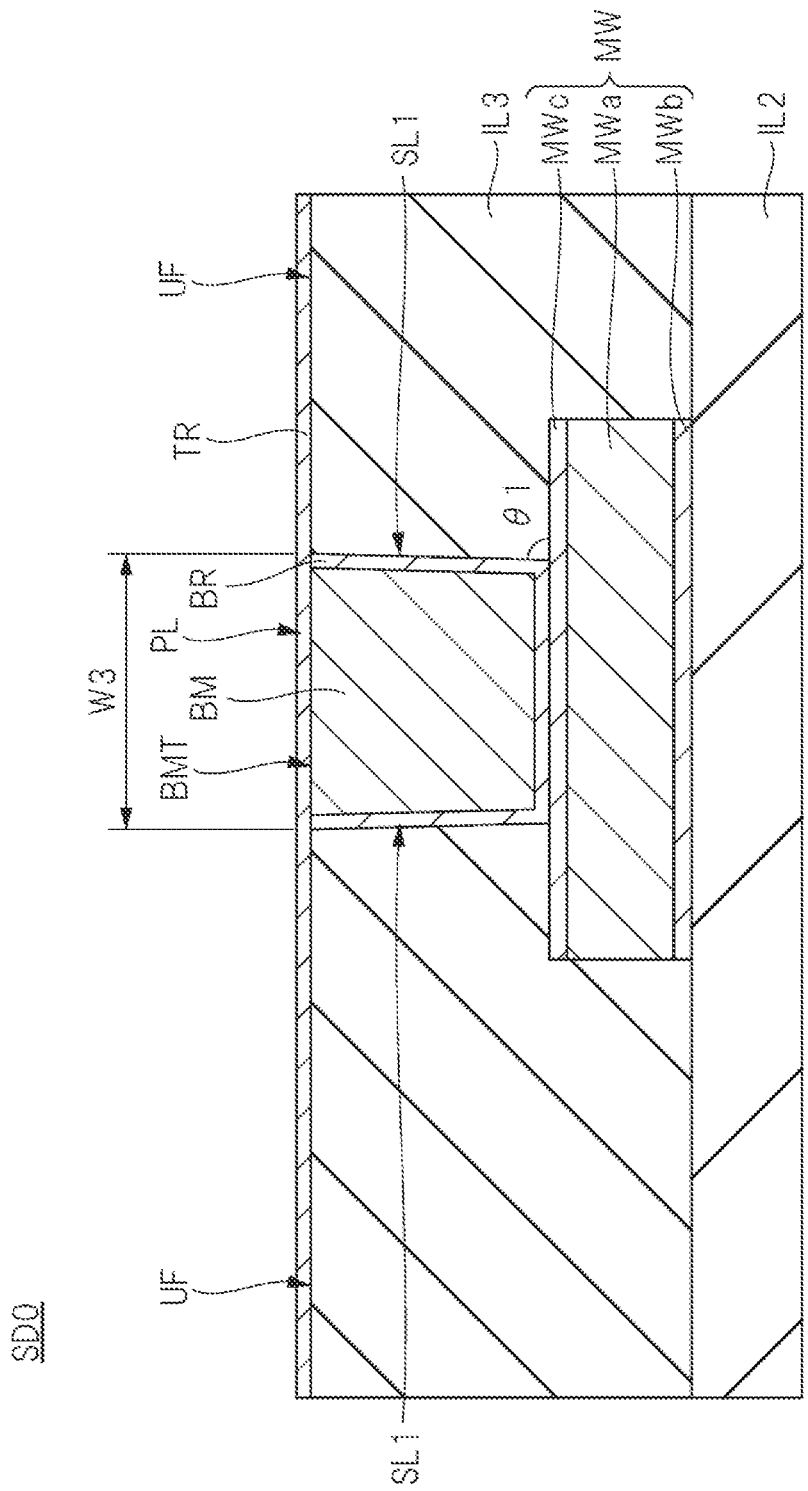
FIG. 12 is a cross-sectional view showing a manufacturing process of the semiconductor device of the comparative example subsequent to FIG. 11.
Figure 17:
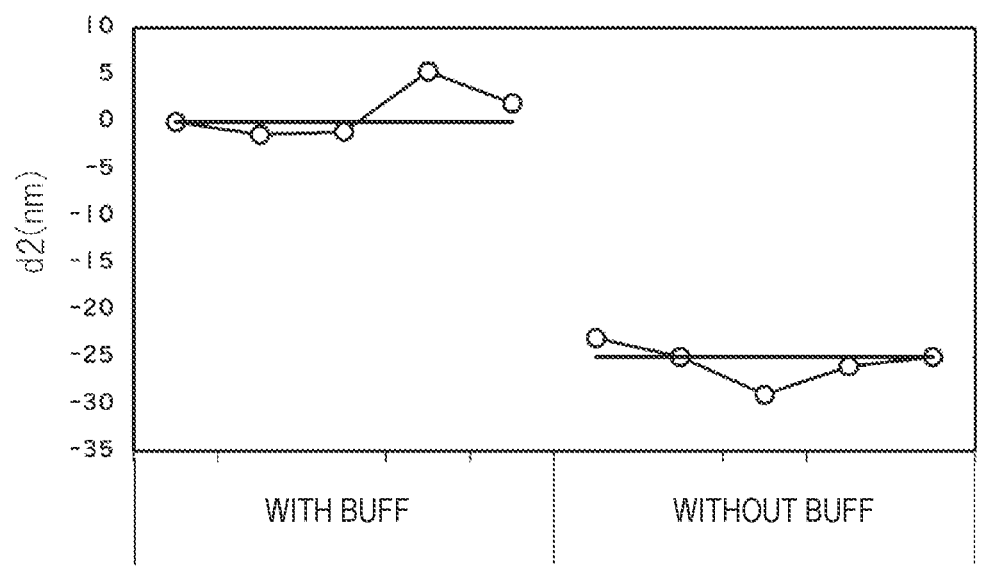
FIG. 17 is a diagram showing height variation of the polished surface in CMP.

FIG. 4 is a process flow chart showing a manufacturing process of the semiconductor device of the present embodiment. FIGS. 5 to 10 are cross-sectional views showing the manufacturing process of the semiconductor device of the present embodiment. FIGS. 11 to 12 are cross-sectional views showing a manufacturing process of the semiconductor device according to the comparative example. FIG. 17 is a diagram showing a height variation of the polished surface in CMP. The manufacturing process of the semiconductor device SD of the present embodiment includes steps S1 to S9 shown in FIG. 4.

Figure 5:
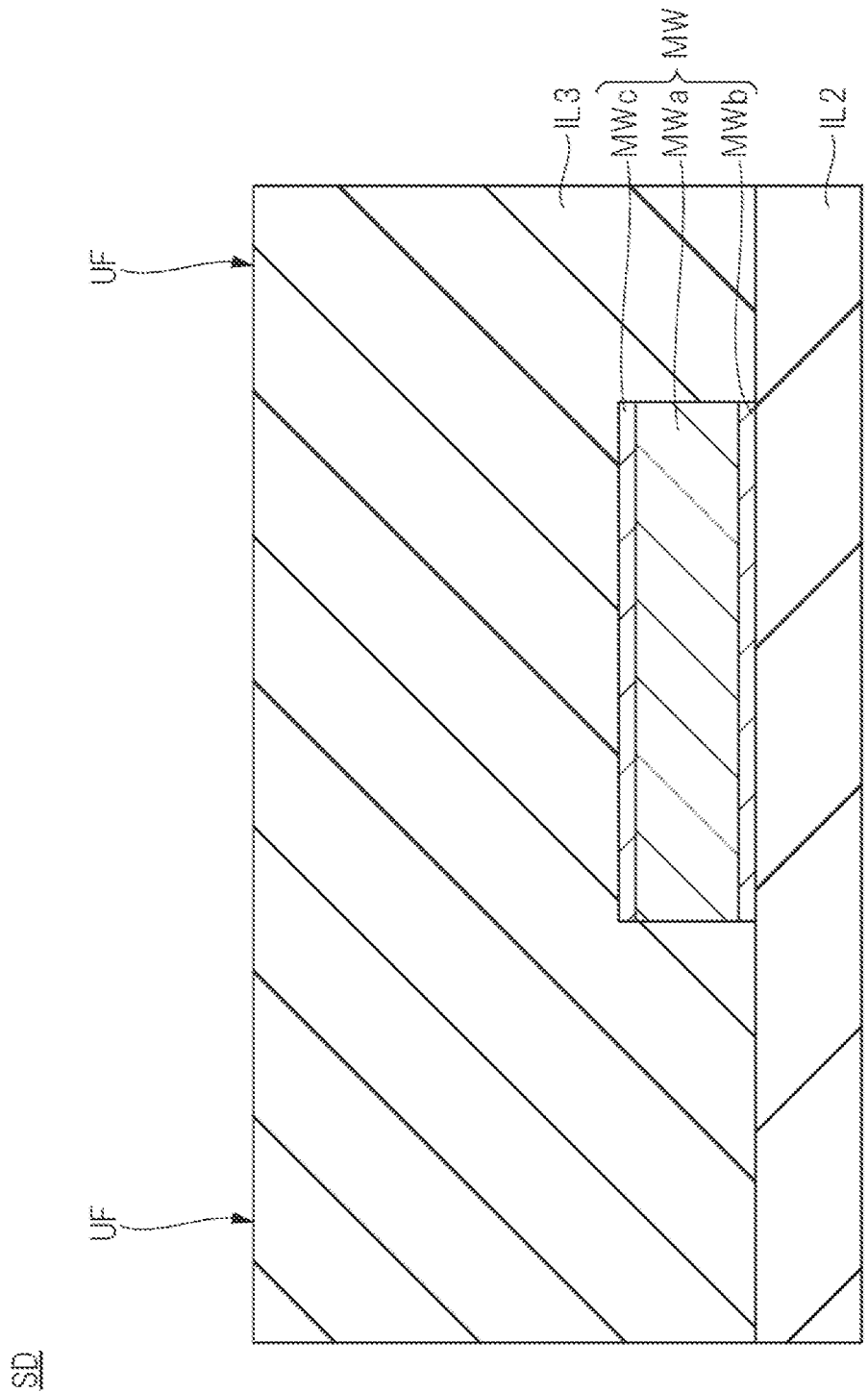
FIG. 5 is a cross-sectional view showing a manufacturing process of the semiconductor device of the present embodiment.

In a wiring layer MW forming step (step S1) and in a dielectric layer IL3 forming step (step S2) shown in FIG. 4, as shown in FIG. 5, the wiring layer MW is formed on the dielectric layer IL2. The upper surface of the dielectric layer IL2 is planarized by a CMP method, and the wiring layer MW is formed on the flat surface of the dielectric layer IL2. The wiring layer MW has a stacked structure of the main conductive layer MWa and the barrier layers MWb and MWc. The main conductive layer MWa is, for example, a metal film formed of aluminum (Al) or copper (Cu) as the main component. The barrier layers MWb and MWc are formed of, for example, a stacked film of titanium (Ti) and titanium nitride (TiN) on titanium (Ti), a tantalum nitride (TaN) film, or a stacked film of tantalum (Ta) and tantalum nitride (TaN) on tantalum (Ta). Next, the dielectric layer IL3 is formed so as to cover the wiring layer MW. The upper surface UF of the dielectric layer IL3 is planarized by the CMP method and is parallel to or almost in parallel to the main surface SBa of the semiconductor substrate SB. The dielectric layer IL3 is formed of, for example, an oxide film, a nitride film, or a stacked film of an oxide film and a nitride film.

Figure 6:
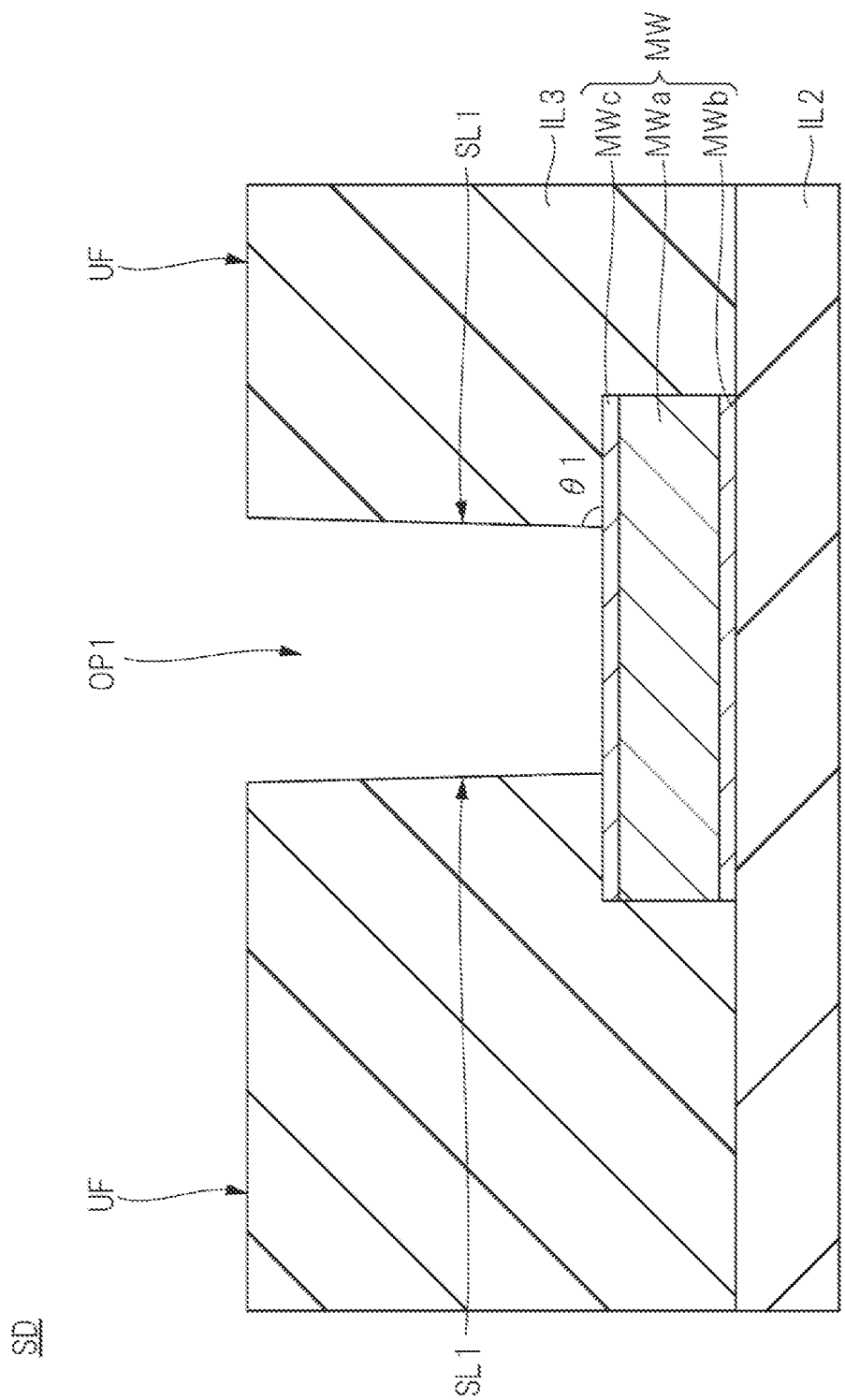
FIG. 6 is a cross-sectional view showing a manufacturing process of the semiconductor device of the present embodiment subsequent to FIG. 5.

In a first opening OP1 forming step (step S3) shown in FIG. 4, as shown in FIG. 6, the first opening OP1 is formed in the dielectric layer IL3, and a part of the wiring layer MW is exposed. The first opening OP1 is formed by performing an anisotropic etching to the dielectric layer IL3. The first opening OP1 is surrounded by the first incline surface SL1 formed in the dielectric layer IL3, and is defined by the first incline surface SL1. The first incline surface SL1 reaches the wiring layer MW from the upper surface UF of the dielectric layer IL3. The first incline surface SL1 has a first incline angle θ1 to the main surface SBa of the semiconductor substrate SB, and the first incline angle θ1 is, for example, 87° (84°≤θ1<90°).

Figure 7:
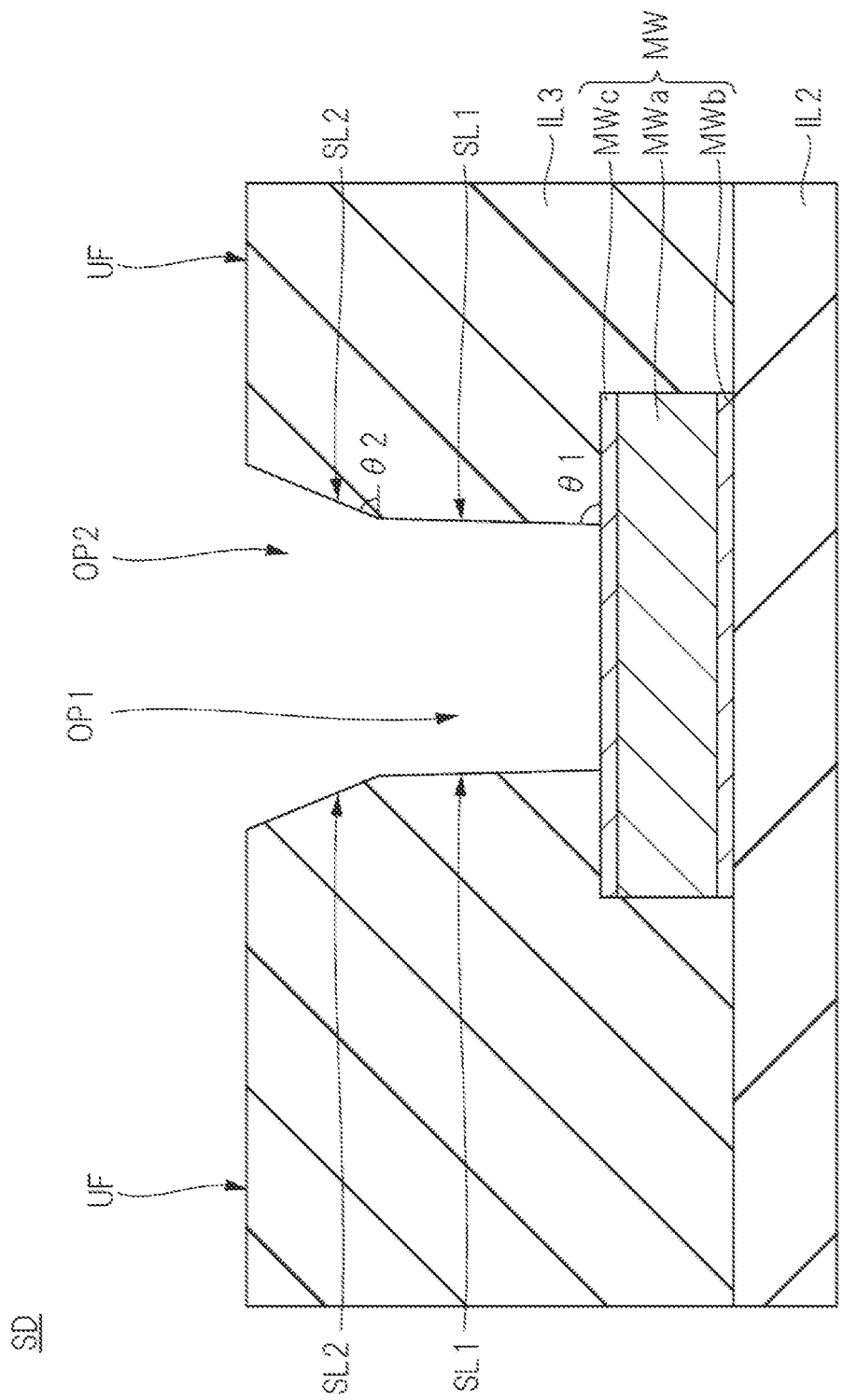
FIG. 7 is a cross-sectional view showing a manufacturing process of the semiconductor device of the present embodiment subsequent to FIG. 6.

In a second opening OP2 forming step (step S4) shown in FIG. 4, as shown in FIG. 7, the second opening OP2 is formed on the first opening OP1. The second opening OP2 is surrounded by the second incline surface SL2 and is defined by the second incline surface SL2. The second incline surface SL2 has a second incline angle θ2 to the main surface SBa of the semiconductor substrate SB, and the second incline angle θ2 is, for example, 70° (65°≤θ2<75°). The second incline surface SL2 is formed by performing a sputter etching (sputter etching treatment) on the dielectric layer IL3 having the first incline surface SL1 in an argon (Ar) atmosphere. The oxide or the like on the wiring layer MW exposed from the first opening OP1 can be removed by the sputter etching.

Figure 8:
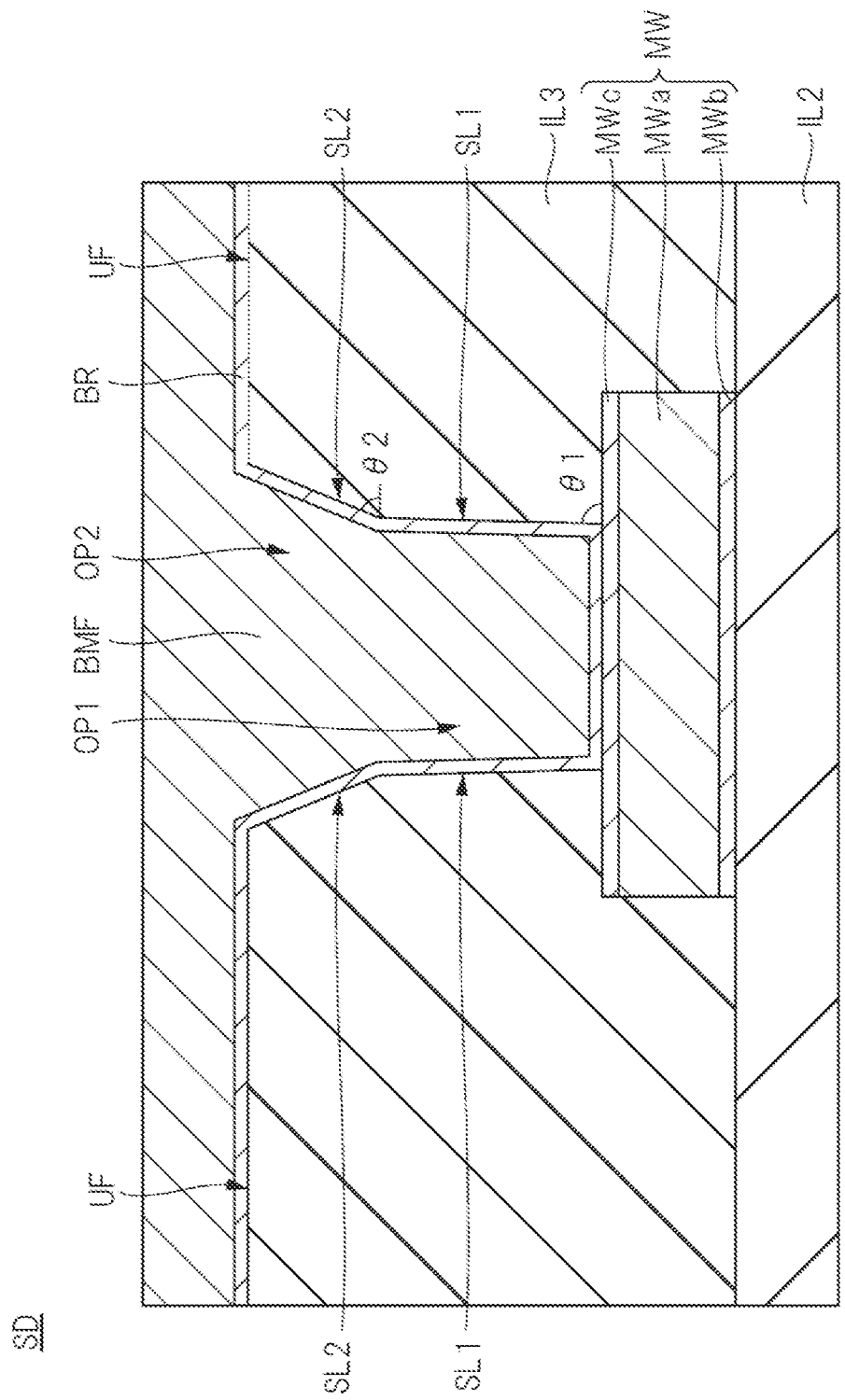
FIG. 8 is a cross-sectional view showing a manufacturing process of the semiconductor device of the present embodiment subsequent to FIG. 7.

In a barrier layer BR forming step (step S5) and in a buried metal layer BMF depositing step (step S6) shown in FIG. 4, as shown in FIG. 8, the barrier layer BR is deposited on the bottom of the first opening OP1 (in other words, on the wiring layer MW exposed at the first opening OP1), on the first incline surface SL1, on the second incline surface SL2, and the upper surface UF of the dielectric layer IL3. Next, the buried metal layer BMF is deposited on the barrier layer BR, and the buried metal layer BMF fills the first opening OP1 and the second opening OP2. The barrier layer BR is, for example, a stacked film of a titanium (Ti) film (lower layer) and a titanium nitride (TiN) film (upper layer), and the film thickness of the stacked film is about 50 nm. The buried metal layer BMF is, for example, a metal film formed of tungsten (W) as the main component, and the film thickness of the buried metal layer BMF is 200 nm to 800 nm. The buried metal layer BMF may be a metal film formed of copper (Cu) as the main component, and in such case, the barrier layer BR may be, for example, a tantalum nitride (TaN) film.

A CMP step (step S7) shown in FIG. 4 will be described with reference to FIG. 9. The filling portion FM which is a part of the buried layer BM is formed by the CMP method, and the barrier layer BR exposed from the filling portion FM is formed on the second incline surface SL2. The buried metal layer BMF and the barrier layer BR on the upper surface UF of the dielectric layer IL3 are polished and removed using the CMP method. That is, the buried metal layer BMF and the barrier layer BR formed outside the first opening OP1 and the second opening OP2 are removed. Further, polishing is advanced, the buried metal layer BMF in the second opening OP2 is partially removed, and the polished surface BMT of the buried metal layer BMF is lowered by the depth d2 from the upper surface UF. In this way, the filling portion FM which is a part of the buried layer BM filling the first opening OP1 and a part of the second opening OP2 is formed. The polished surface BMT is located in the middle of the second incline surface SL2, but the depth d2 is preferably 10 nm≤d2<50 nm. By reducing the polished surface BMT by a predetermined value or more from the upper surface UF, it is possible to prevent the buried metal layer BMF and the barrier layer BR from remaining on the upper surface UF. In the CMP step, a hard polishing pad and a slurry having a higher polishing rate in the buried metal layer BMF to the dielectric layer IL3 are used. The hard polishing pad is a polishing pad in which, for example, foamed polyurethane is disposed on a side of the polishing target film. In addition, in the CMP step, it is important to leave the barrier layer BR exposed from the filling portion FM on the second incline surface SL2 by utilizing the fact that the polishing rate of the barrier layer BR is smaller than the polishing rate of the buried metal layer BMF. That is, by sufficiently lowering the polished surface BMT from the upper surface UF of the dielectric layer IL3 (in the depth d2≥10 nm), it is possible to form the barrier layer BR protruding from the filling portion FM and extending on the second incline surface SL2. Further, in the CMP step, the second incline surface SL2 exposed from the barrier layer BR and the upper surface UF are polished to form the third incline surface SL3. A third opening OP3 is located on the second opening OP2 and is surrounded by the third incline surface SL3 (in other words, defined by the third incline surface SL3). The third incline surface SL3 has a third incline angle θ3 to the main surface SBa of the semiconductor substrate SB, and the third incline angle θ3 is, for example, 20° (15°≤θ3<25°).

Figure 10:
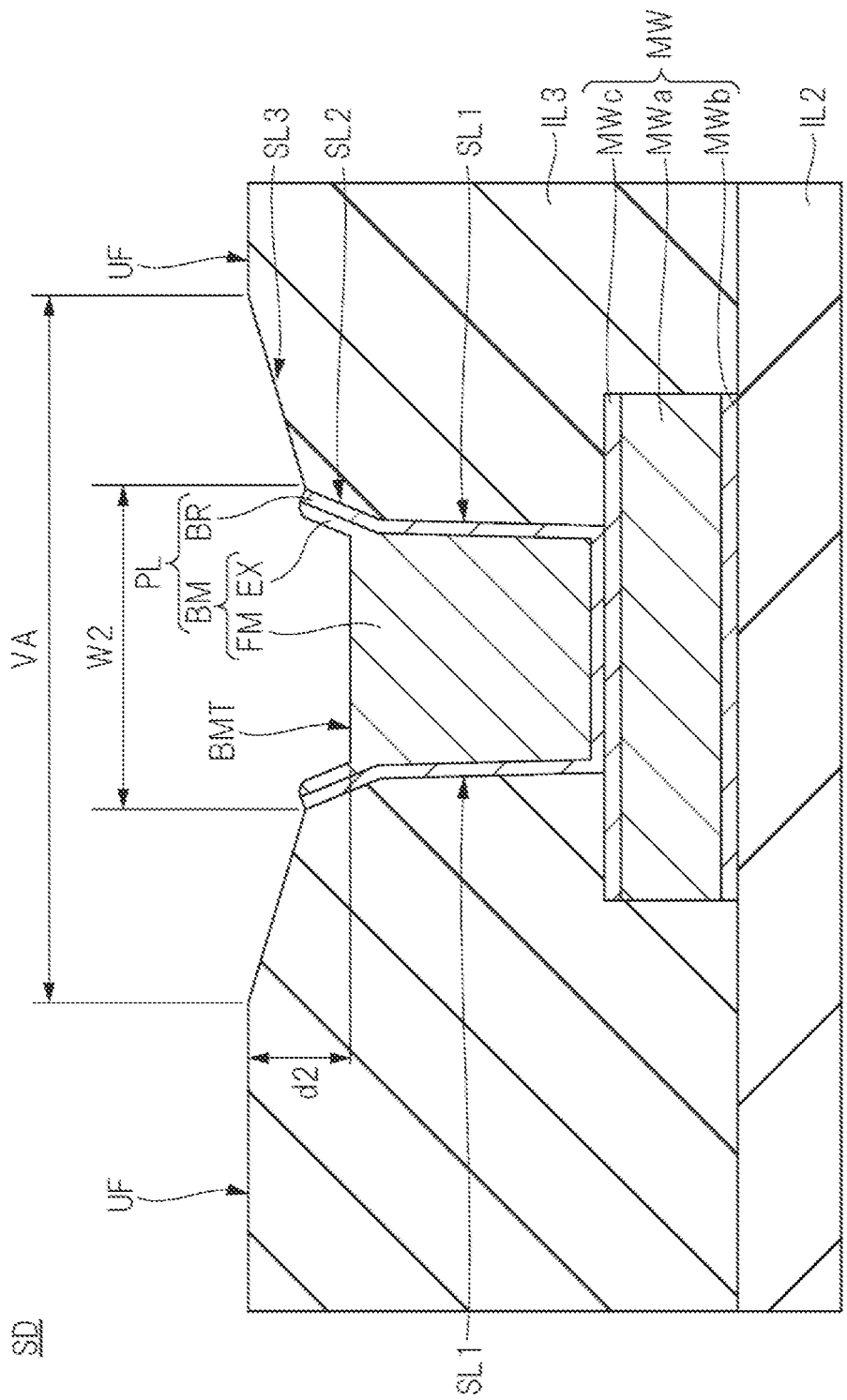
FIG. 10 is a cross-sectional view showing a manufacturing process of the semiconductor device of the present embodiment subsequent to FIG. 9.

In a sputter etching step (step S8) shown in FIG. 4, as shown in FIG. 10, the extension portion EX is formed on the barrier layer BR exposed from the filling portion FM of the buried layer BM on the second incline surface SL2. The extension portion EX is continuously formed so as to protrude from the filling portion FM, and the filling portion FM and the extension portion EX constitute the buried layer BM. The buried layer BM and the barrier layer BR constitute the plug electrode PL. The extension portion EX is formed by performing a sputter etching (sputter etching treatment) to the filling portion FM in an argon (Ar) atmosphere. The metal atoms of the filling portion FM are scattered and deposited on the barrier layer BR on the second incline surface SL2 by the sputter etching, thereby forming the extension portion EX. Since the second incline angle θ2 of the second incline surface SL2 is relatively large, the incline angle θ3 of the third incline surface SL3 is smaller than the incline angle θ2 of the second incline surface SL2, and the upper surface UF is substantially parallel to the main surface SBa of the semiconductor substrate SB and has no incline angle, the extension portion EX can be selectively formed on the barrier layer BR on the second incline surface SL2.

In a thin film resistor TR forming step (step S9) shown in FIG. 4, as shown in FIG. 3, the thin film resistor TR is formed on the plug electrode PL and the dielectric layer IL3. The thin film resistor TR is in contact with the filling portion FM, the extension portion EX, and the barrier layer BR of the plug electrode PL. The thin film resistor TR on the plug electrode PL extends on the upper surface UF via the third incline surface SL3. The thin film resistor TR is formed using, for example, a sputtering method. After that, the thin film resistor TR is processed into a rectangular pattern shown in FIG. 1 by using the mask layer MK shown in FIG. 2.

A manufacturing method of the semiconductor device SD0 of the comparative example will be described with reference to FIGS. 11 to 12. In the semiconductor device SD0 of the comparative example, a buff polishing step is added to the CMP step (step S7) shown in FIG. 4. By performing the buff polishing following the polishing (referred to as "buff-less polishing") described in FIG. 9, as shown in FIG. 11, the polished surface BMT of the buried layer BM and the upper surface UF of the dielectric layer IL3 can be aligned at equal heights (with reference to the main surface SBa of the semiconductor substrate SB). The buff polishing is performed on the structural member that has been subjected to the buff-less polishing shown in FIG. 9, and the buff polishing is finished at a position where the polished surface BMT reaches the first incline surface SL1. For the buff polishing, for example, a soft polishing pad and a slurry having higher polishing rate in the dielectric layer IL3 to the buried metal layer BMF are used. The soft polishing pad is a polishing pad in which, for example, a nonwoven fabric is disposed on a side of a polishing target film.

Next, after the sputter etching step (step S8) shown in FIG. 4 is performed, a thin film resistor TR forming step (step S9) shown in FIG. 4 is performed, and as shown in FIG. 12, the thin film resistor TR is formed on the plug electrode PL and the upper surface UF of the dielectric layer IL3.

When the buff polishing is added after the buff-less polishing, the polished surface BMT of the plug electrode PL and the upper surface UF of the dielectric layer IL3 have the same height, and thus disconnection of the thin film resistor TR can be prevented. However, because the width W3 of the contact area between the plug electrode PL and the thin film resistor TR is reduced as compared with the width W2 shown in FIG. 10, the contact resistance between the plug electrode PL and the thin film resistor TR is increased. Further, the addition of the buff polishing increases the manufacturing cost.

Features of Semiconductor Device and Manufacturing Method of Present Embodiment

According to the semiconductor device of the present embodiment, as shown in FIG. 3, since the buried layer BM includes the filling portion FM and the extension portion EX extending from the filling portion FM, the contact resistance between the plug electrode PL and the thin film resistor TR can be reduced.

Further, as shown in FIG. 3, since the thin film resistor TR formed on the plug electrode PL extends on the upper surface of the dielectric layer IL3 via the third incline surface SL3 which is inclined more gently than the first incline surface SL1 and the second incline surface SL2, the disconnection of the thin film resistor TR can be prevented or suppressed.

Further, as shown in FIG. 3, in the via hole VA, the thin film resistor TR extends on the third incline surface SL3 without interposing the barrier layer BR and the buried layer BM. That is, the thin film resistor TR on the third incline surface SL3 constitutes a part of the resistor element. The third incline surface SL3 has a third incline angle θ3 to the main surface SBa of the semiconductor substrate SB, in other words, has a third incline angle θ3 to the upper surface UF of the dielectric layer IL3. Therefore, as compared with the case where the via hole VA does not include the third incline surface SL3 and the upper surface UF extends to the barrier layer BR, the distance between the two plug electrodes PL connected to the thin film resistor TR can be shortened in plan view. In other words, the semiconductor device SD can be downsized.

According to the manufacturing method of the semiconductor device of the present embodiment, the CMP step (step S7) shown in FIG. 4 has only "buff-less polishing", and the sputter etching step (step S8) shown in FIG. 4 is performed without performing the "buff polishing" described in the comparative example of FIG. 11. Since the plug electrode PL is formed by a CMP method using "buff-less polishing", the manufacturing cost can be reduced.

Figure 9:
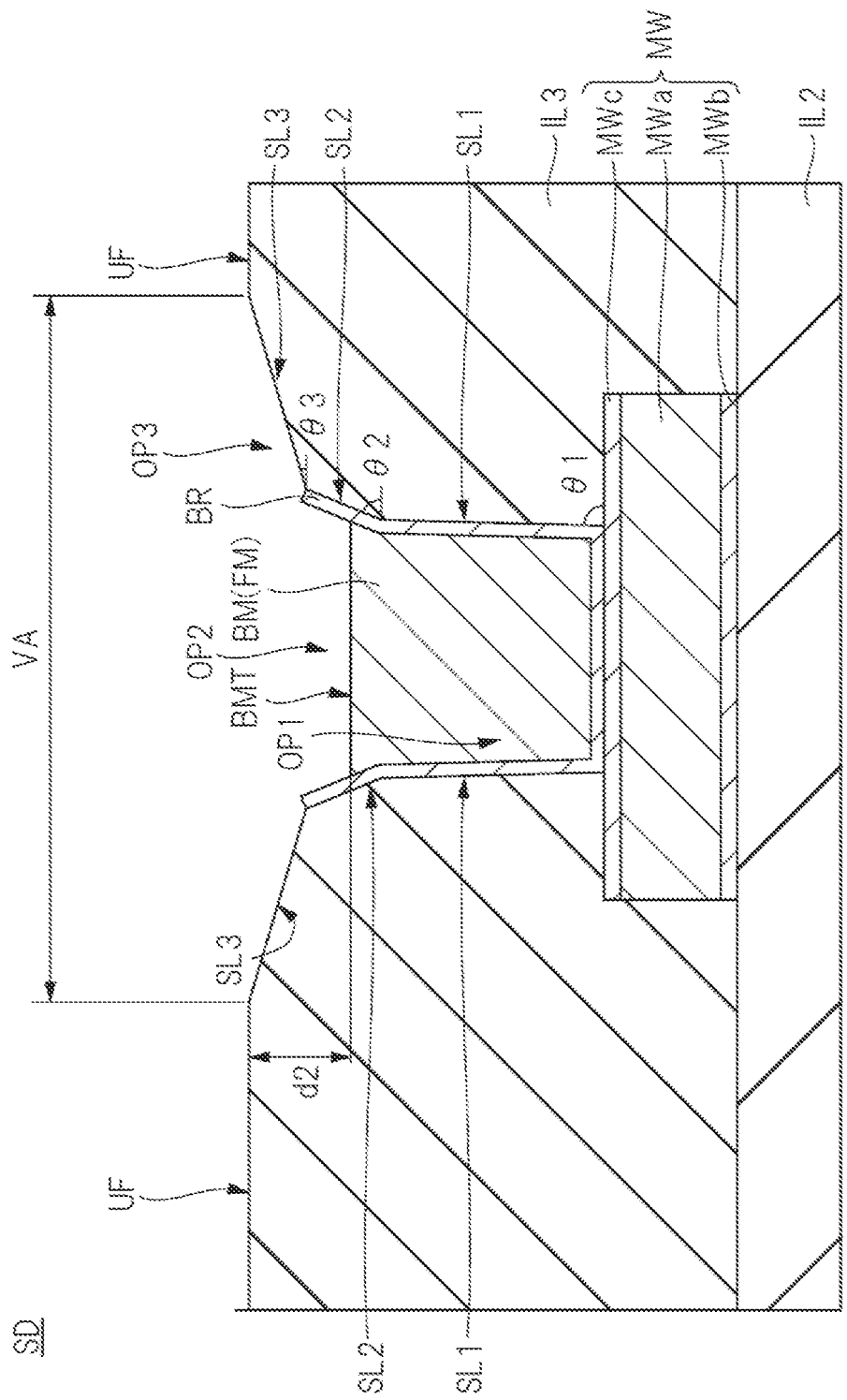
FIG. 9 is a cross-sectional view showing a manufacturing process of the semiconductor device of the present embodiment subsequent to FIG. 8.

According to the manufacturing method of the semiconductor device of the present embodiment, in the CMP step shown in FIG. 9 (step S7 in FIG. 4), the polished surface BMT is intentionally lowered deeply from the upper surface UF of the dielectric layer IL3. Then, the barrier layer BR exposed from the filling portion BMF is formed on the second incline surface SL2 by utilizing the differences in polishing rates between the barrier layer BR and the buried metal layer FM. Next, in the sputter etching step shown in FIG. 10 (step S8 in FIG. 4), the extension portion EX which is a part of the buried layer BM is formed on the exposed barrier layer BR. Next, in the thin film resistor TR forming step (step S9 in FIG. 4) shown in FIG. 3, the thin film resistor TR is formed so as to be in contact with the filling portion FM and the extension portion EX constituting the buried layer BM. With such a manufacturing method, the contact resistance between the thin film resistor TR and the plug electrode PL can be reduced. That is, in the CMP step shown in FIG. 9, in order to form the barrier layer BR exposed from the filling portion FM, it is important to set the depth d2 of the polished surface BMT with respect to the upper surface UF of the dielectric layer IL3 to be equal to or greater than 10 nm.

FIG. 17 is a diagram showing height variations in the polished surface BMT of the plug electrode PL in CMP. In FIG. 17, the height variations of the polished surface BMT of the five samples subjected to "buff polishing" or "buff-less polishing". In FIG. 17, "buff polishing" is indicated as "with buff", and "buff-less polishing" is indicated as "without buff". The vertical axis d2 is a distance from the polished surface BMT to the upper surface UF of the dielectric layer IL3, and corresponds to d2 shown in FIGS. 3 and 9. In the vertical axis of FIG. 17, "−5" means that the height of the polished surface BMT is 5 nm deeper (lower) than the height of the upper surface UF. In "with buff", there is a variation of ±5 nm or less with respect to the height setting value (0 nm) of the polished surface BMT, and in "without buff", there is a variation of ±5 nm or less with respect to the height setting value (25 nm) of the polished surface BMT. Therefore, it is assumed that, for example, a step with 5 nm as largest is generated between the polished surface BMT and the upper surface UF in "buff polishing". According to studies by the inventors of the present application, it has been confirmed that the barrier layer BR exposed from the filling portion FM cannot be formed at this level of step. That is, in the comparative example, even if the height variation of the polished surface BMT due to the "buff polishing" occurs, the barrier layer BR exposed from the filling portion FM is not formed.

Modified Example

Figure 13:
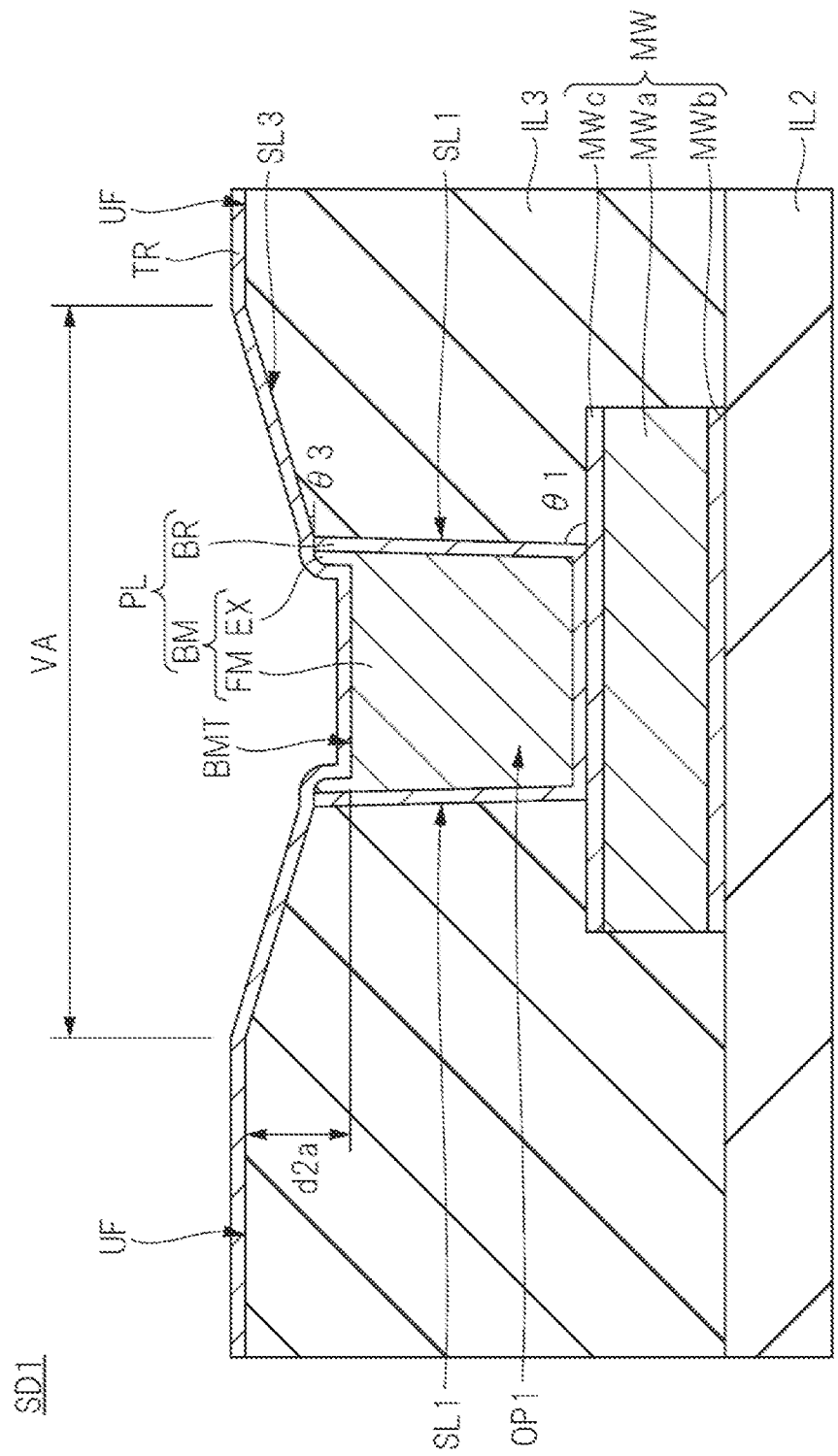
FIG. 13 is a cross-sectional view of a semiconductor device of a modified example.
Figure 14:
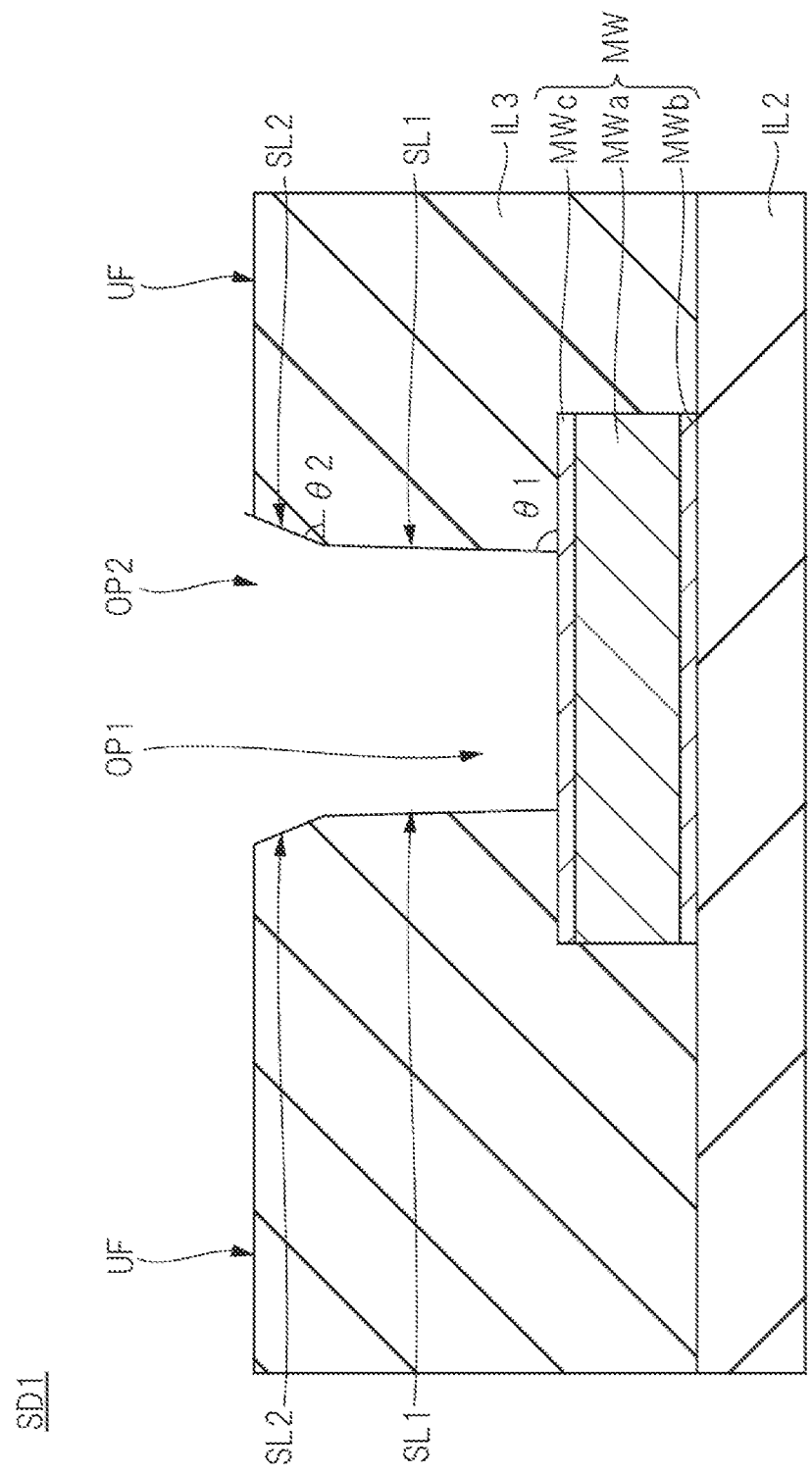
FIG. 14 is a cross-sectional view showing a manufacturing process of the semiconductor device of the modified example.
Figure 15:
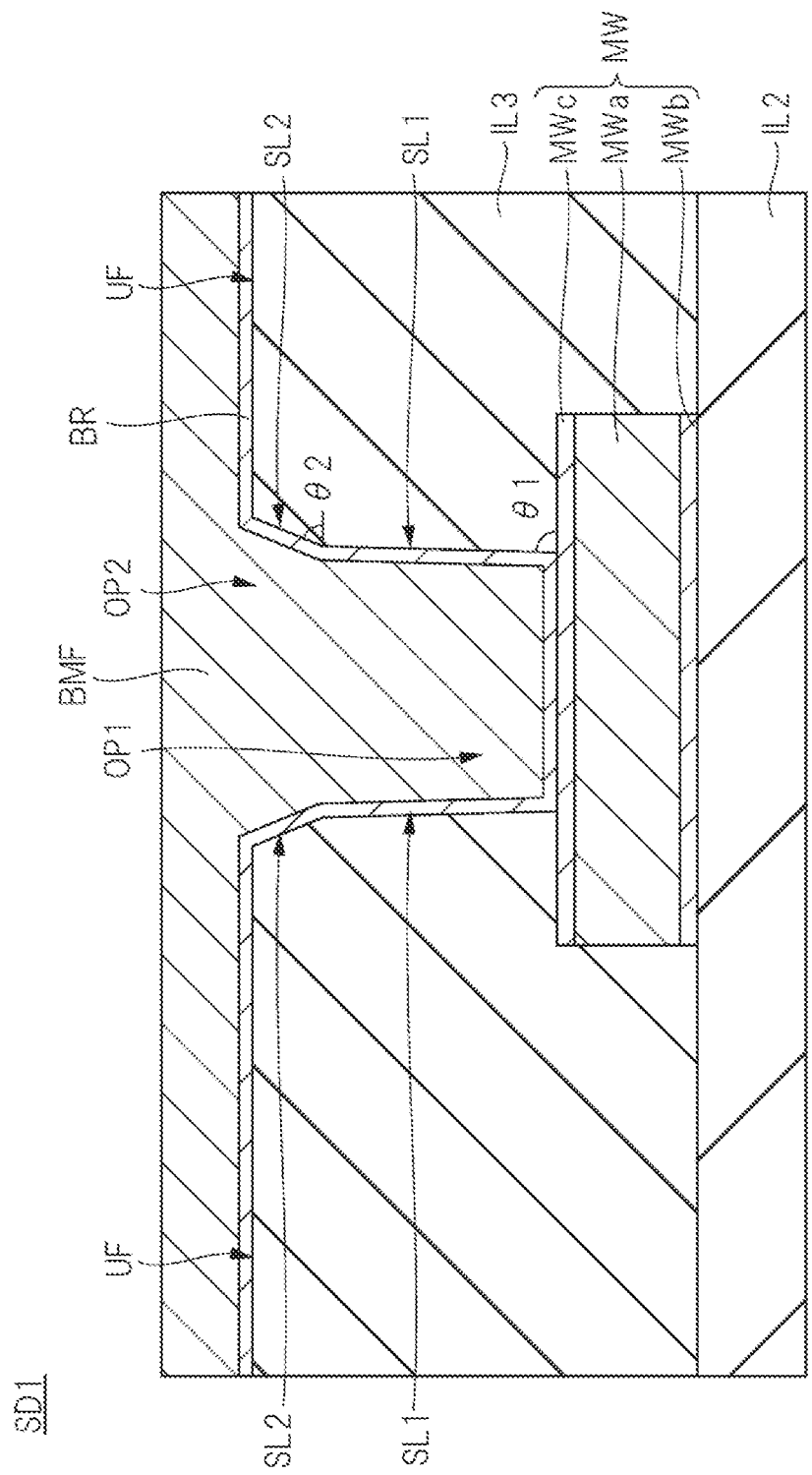
FIG. 15 is a cross-sectional view showing a manufacturing process of the semiconductor device of the modified example subsequent to FIG. 14.
Figure 16:
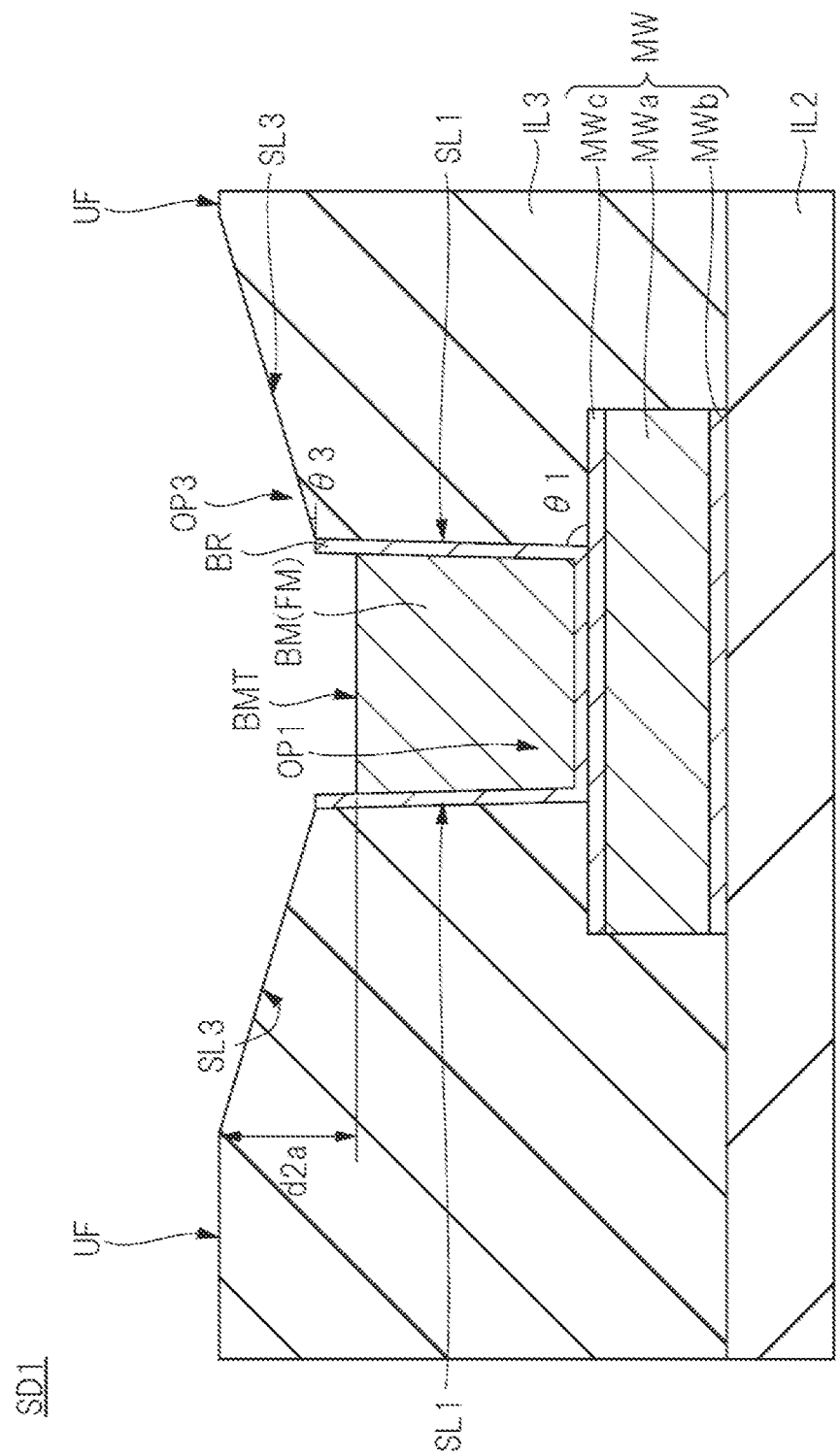
FIG. 16 is a cross-sectional view showing a manufacturing process of the semiconductor device of the modified example subsequent to FIG. 15.

In the modified example, a structure without the second incline surface SL2 of FIG. 3 is formed. FIG. 13 is a cross-sectional view of the semiconductor device of the modified example. FIGS. 14 to 16 are cross-sectional views showing a manufacturing process of the semiconductor device of the modified example. The manufacturing step of the semiconductor device of the modified example is the same as that shown in FIG. 4, and FIGS. 14 to 16 correspond to FIGS. 7 to 9.

As shown in FIG. 13, in the semiconductor device SD1 of the modified example, the via hole VA is an opening surrounded (defined) by the first incline surface SL1 and the third incline surface SL3 provided in the dielectric layer IL3. The plug electrode PL is formed in the first opening OP1, and the extension portion EX of the buried layer BM is formed on the first incline surface SL1.

Since the extension portion EX and the barrier layer BR are formed on the first incline surface SL1 having the incline angle θ1 to the main surface SBa of the semiconductor substrate SB, the contact resistance between the thin film resistor TR and the plug electrode PL can be reduced.

Further, since the thin film resistor TR on the plug electrode PL extends on the upper surface UF of the dielectric layer IL3 via the third incline surface SL3 which is inclined more gently than the first incline surface SL1, the disconnection of the thin film resistor TR can be prevented or suppressed.

FIG. 14 corresponds to FIG. 7 and shows the second opening OP2 forming step (step S4) of FIG. 4. The second opening OP2 is shallower than the second opening OP2 shown in FIG. 7.

FIG. 15 corresponds to FIG. 8 and shows the barrier layer BR deposition step (step S5) and the buried metal layer BMF deposition step (step S6) of FIG. 4. The description of FIG. 15 is the same as the description of FIG. 8.

FIG. 16 corresponds to FIG. 9 and shows the CMP step (step S7) of FIG. 4. As shown in FIG. 16, the polished surface BMT of the filling portion FM of the buried layer BM reaches the first incline surface SL1 and has a depth d2a thereof. In the CMP step, the second incline surface SL2 in FIG. 15 is no longer polished, and the third incline surface SL3 is formed following the first incline surface SL1.

Next, the sputter etching step (step S8) and the thin film resistor TR forming step (step S9) of FIG. 4 are performed, and as shown in FIG. 13, the extension layer EX is formed on the barrier layer BR on the first incline surface SL1 and the thin film resistor TR is formed on the plug electrode PL.

Also in the modified example, it is possible to prevent or suppress disconnection of the thin film resistor TR as in the above-described embodiment.

In addition, as in the above-described embodiment, it is possible to shorten the distance between the two plug electrodes PL connected to the thin film resistor TR in plan view.

In addition, since CMP step is the buff-less polishing, the manufacturing cost can be reduced.

The invention made by the present inventor has been described above in detail based on the embodiment, but the present invention is not limited to the embodiment described above, and it is needless to say that various modifications can be made without departing from the gist thereof.

In addition, some of the contents described in the above embodiment mode will be described below.

Appendix 1

A semiconductor device includes: a semiconductor substrate having a main surface; a wiring layer formed on the main surface of the semiconductor substrate; a dielectric layer provided so as to cover the wiring layer, the dielectric layer having an upper surface and a via hole exposing a part of the wiring layer; a plug electrode provided in the via hole; and a thin film resistor provided on the plug electrode and the dielectric layer and electrically connected to the wiring layer via the plug electrode, wherein the via hole includes: a first incline surface of which a periphery is in contact with the dielectric layer; and a second incline surface connected to the first incline surface, wherein the first incline surface has a first incline angle to the main surface, wherein the second incline surface has a second incline angle to the main surface, wherein the first incline angle is smaller than 90 degrees, wherein the second incline angle is smaller than the first incline angle, wherein the plug electrode includes: a barrier layer extending on the first incline surface; and a buried layer provided on the barrier layer, wherein the buried layer includes: a filling portion formed on the barrier layer and filling a region surrounded by the first incline surface; and an extension portion extending from the filling portion to the upper surface, and wherein the thin film resistor is in contact with the filling portion and the extension portion.

Appendix 2

A method of manufacturing a semiconductor device including a wiring layer, a dielectric layer covering the wiring layer, a thin film resistor provided on the dielectric layer, and a plug electrode provided in the dielectric layer, connecting the thin film resistor to the wiring layer and including a barrier layer and a buried layer, the method including: (a) preparing a semiconductor substrate having a main surface, the wiring layer provided on the main surface of the semiconductor substrate, and the dielectric layer covering the wiring layer and having an upper surface; (b) forming a first opening in the dielectric layer, the first opening exposing a part of the wiring layer and being surrounded by a first incline surface; (c) forming a second opening surrounded by a second incline surface in an upper portion of the first opening; (d) forming a barrier layer on the wiring layer exposed from the first opening, on the first incline surface, on the second incline surface and on the upper surface; (e) forming a buried metal layer on the barrier layer to fill the first opening and the second opening; (f) performing a CMP treatment to the buried metal layer and removing the barrier layer and the buried metal layer on the upper surface and in the second opening, thereby forming a filling portion configuring a part of the buried layer so as to fill a part of the first opening; (g) performing a sputter etching treatment to the filling portion, thereby forming an extension portion extending from the filling portion on the barrier layer along the first incline surface and configuring a part of the buried layer; and (h) forming the thin film resistor on the plug electrode so as to be in contact with the filling portion and the extension portion, wherein in the (f), forming a third incline surface connected to the first incline surface by removing the second incline surface, wherein the first incline surface has a first incline angle to the main surface, wherein the third incline surface has a third incline angle to the main surface, wherein the first incline angle is smaller than 90 degrees, and wherein the third incline angle is smaller than the first incline angle.

What is claimed is:

1. A semiconductor device comprising:
   a semiconductor substrate having a main surface;
   a wiring layer formed on the main surface of the semiconductor substrate;
   a dielectric layer provided so as to cover the wiring layer, the dielectric layer having an upper surface and a via hole exposing a part of the wiring layer;
   a plug electrode provided in the via hole; and
   a thin film resistor provided on the plug electrode and the dielectric layer and electrically connected to the wiring layer via the plug electrode,
   wherein the via hole includes:
      a first incline surface of which a periphery is in contact with the dielectric layer; and
      a second incline surface connected to the first incline surface,
   wherein the first incline surface has a first incline angle to the main surface,
   wherein the second incline surface has a second incline angle to the main surface,
   wherein the second incline angle is smaller than the first incline angle,
   wherein the plug electrode includes:
      a barrier layer extending on the first incline surface and the second incline surface; and
      a buried layer provided on the barrier layer,
   wherein the buried layer includes:
      a filling portion formed on the barrier layer and filling a region surrounded by the first incline surface; and
      an extension portion extending on the barrier layer from the filling portion along the second incline surface, and
   wherein the thin film resistor is in contact with the filling portion and the extension portion.

2. The semiconductor device according to claim 1, wherein the upper surface is almost in parallel to the main surface,
   wherein, in a direction orthogonal to the main surface, a distance from a tip of the extension portion to the upper surface is a first depth, and
   wherein a second depth from the upper surface to a polished surface which is an upper surface of the filling portion is larger than the first depth.

3. The semiconductor device according to claim 1, wherein the via hole includes a third incline surface,
   wherein the second incline surface connects the first incline surface and the third incline surface,
   wherein the third incline surface has a third incline angle to the main surface,
   wherein the third incline angle is smaller than the second incline angle, and
   wherein the thin film resistor provided on the plug electrode extends on the upper surface via the third incline surface.

4. The semiconductor device according to claim 1, wherein the thin film resistor is in contact with the barrier layer provided between the second incline surface and the extension portion.

5. The semiconductor device according to claim 1, wherein a film thickness of the thin film resistor is smaller than a film thickness of the barrier layer.

6. The semiconductor device according to claim 1, wherein the thin film resistor is formed of SiCr, SiCrC, NiCr, TiN or TaN.

7. The semiconductor device according to claim 1, wherein the buried layer is formed of a metal film with tungsten or copper as a main component.

* * * * *